(12) United States Patent
Masleid et al.

(10) Patent No.: US 7,313,779 B1
(45) Date of Patent: Dec. 25, 2007

(54) METHOD AND SYSTEM FOR TILING A BIAS DESIGN TO FACILITATE EFFICIENT DESIGN RULE CHECKING

(75) Inventors: Robert Paul Masleid, Monte Sereno, CA (US); Steven T. Stoiber, Los Altos, CA (US)

(73) Assignee: Transmeta Corporation, Santa Clara, CA (US)

( * ) Notice: Subject to any disclaimer, the term of this patent is extended or adjusted under 35 U.S.C. 154(b) by 228 days.

(21) Appl. No.: 10/964,409

(22) Filed: Oct. 12, 2004

(51) Int. Cl.
*G06F 17/50* (2006.01)
(52) U.S. Cl. .............................. 716/18; 716/1; 716/10
(58) Field of Classification Search .................. 716/10, 716/4–6, 1, 18
See application file for complete search history.

(56) References Cited

U.S. PATENT DOCUMENTS

| | | | |
|---|---|---|---|
| 6,424,022 B1 * | 7/2002 | Wu et al. .................... | 257/665 |
| 6,694,502 B2 * | 2/2004 | Mehrotra et al. ............. | 716/12 |
| 6,885,210 B1 * | 4/2005 | Suzuki ........................ | 324/763 |
| 7,098,512 B1 * | 8/2006 | Pelham et al. ............... | 257/371 |
| 7,151,417 B1 * | 12/2006 | Suzuki ........................ | 331/185 |
| 7,211,478 B1 * | 5/2007 | Pelham et al. .............. | 438/197 |
| 2001/0029601 A1 * | 10/2001 | Kimura et al. ................ | 716/19 |
| 2002/0164851 A1 * | 11/2002 | Wu et al. .................... | 438/215 |
| 2003/0088843 A1 * | 5/2003 | Mehrotra et al. ............. | 716/12 |
| 2003/0229876 A1 * | 12/2003 | Mehrotra et al. ............. | 716/13 |
| 2004/0124475 A1 * | 7/2004 | Pelham et al. ............... | 257/371 |
| 2004/0187085 A1 * | 9/2004 | Sinha et al. ................... | 716/4 |
| 2006/0026551 A1 * | 2/2006 | Shrowty et al. .............. | 716/20 |
| 2006/0176252 A1 * | 8/2006 | Date et al. ..................... | 345/76 |

* cited by examiner

*Primary Examiner*—Jack Chiang
*Assistant Examiner*—Suchin Parihar

(57) ABSTRACT

A method and system for tiling a bias design for an integrated circuit device to facilitate efficient design rule checking. The method is implemented in a computer implemented design synthesis system. The method includes receiving a circuit netlist, wherein the circuit netlist represents an integrated circuit design to be realized in physical form. A deep N-well bias voltage distribution structure is provided within the circuit netlist, wherein the structure includes a plurality of tiles arranged to distribute a bias voltage to a plurality of N-wells of the circuit netlist.

16 Claims, 7 Drawing Sheets

METHOD AND SYSTEM FOR TILING A BIAS DESIGN TO FACILITATE EFFICIENT DESIGN RULE CHECKING

TECHNICAL FIELD

Embodiments of the present invention relate to body biasing circuits for providing operational voltages in integrated circuit devices.

BACKGROUND ART

As the operating voltages for CMOS transistor circuits have decreased, variations in the threshold voltages for the transistors have become more significant. Although low operating voltages offer the potential for reduced power consumption and higher operating speeds, threshold voltage variations due to process and environmental variables often prevent optimum efficiency and performance from being achieved. Body-biasing is a prior art mechanism for compensating for threshold voltage variations, and functions by modifying the body bias potential of the transistor, allowing the threshold voltage of the transistor to be adjusted electrically. It is important that the design synthesis tools used to design the body biasing circuit components interoperate properly and allow efficient automated design synthesis checks of the circuit components to isolate flaws, optimize performance, and the like prior to design finalization and fabrication.

DISCLOSURE OF THE INVENTION

Embodiments of the present invention provide a method and system for tiling a bias design configured to facilitate efficient design rule checking.

BRIEF DESCRIPTION OF THE DRAWINGS

The accompanying drawings, which are incorporated in and form a part of this specification, illustrate embodiments of the invention and, together with the description, serve to explain the principles of the invention.

DETAILED DESCRIPTION OF THE EMBODIMENTS

Figure 1:
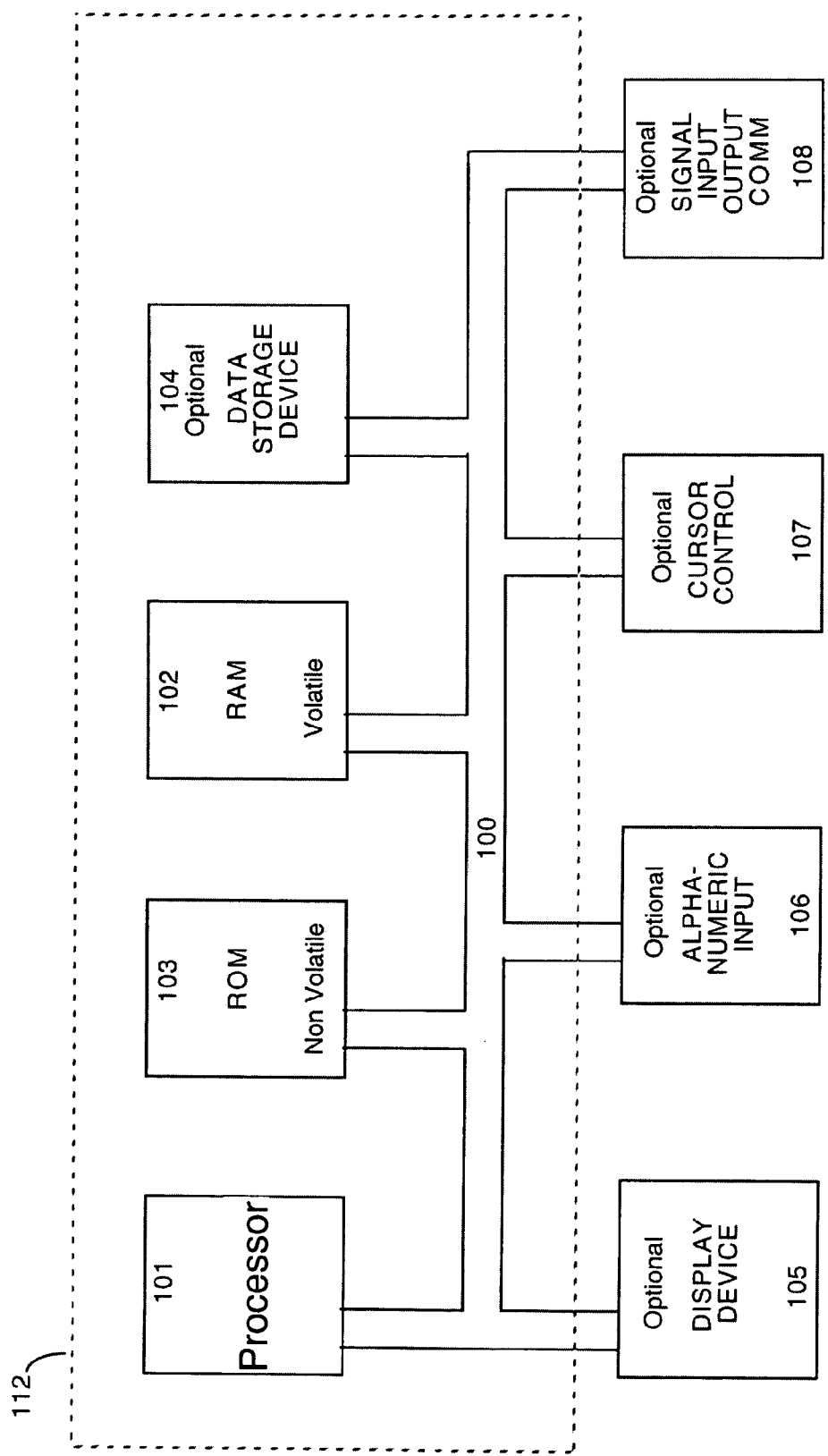
FIG. 1 shows a computer system in accordance with one embodiment of the present invention.

Reference will now be made in detail to the preferred embodiments of the present invention, examples of which are illustrated in the accompanying drawings. While the invention will be described in conjunction with the preferred embodiments, it will be understood that they are not intended to limit the invention to these embodiments. On the contrary, the invention is intended to cover alternatives, modifications and equivalents, which may be included within the spirit and scope of the invention as defined by the appended claims. Furthermore, in the following detailed description of embodiments of the present invention, numerous specific details are set forth in order to provide a thorough understanding of the present invention. However, it will be recognized by one of ordinary skill in the art that the present invention may be practiced without these specific details. In other instances, well-known methods, procedures, components, and circuits have not been described in detail as not to unnecessarily obscure aspects of the embodiments of the present invention.

Notation and Nomenclature

Some portions of the detailed descriptions which follow are presented in terms of procedures, steps, logic blocks, processing, and other symbolic representations of operations on data bits within a computer memory. These descriptions and representations are the means used by those skilled in the data processing arts to convey most effectively the substance of their work to others skilled in the art. A procedure, computer executed step, logic block, process, etc., are here, and generally, conceived to be self-consistent sequences of steps or instructions leading to a desired result. The steps are those requiring physical manipulations of physical quantities. Usually, though not necessarily, these quantities take the form of electrical or magnetic signals capable of being stored, transferred, combined, compared, and otherwise manipulated in a computer system. It has proven convenient at times, principally for reasons of common usage, to refer to these signals as bits, values, elements, symbols, characters, terms, numbers, or the like.

It should be borne in mind, however, that all of these and similar terms are to be associated with the appropriate physical quantities and are merely convenient labels applied to these quantities. Unless specifically stated otherwise as apparent from the following discussions, it is appreciated that throughout the present invention, discussions utilizing terms such as "processing," "computing," "checking," "determining," "optimizing," or the like, refer to the action and processes of a computer system, or similar electronic computing device, that manipulates and transforms data represented as physical (electronic) quantities within the computer system's registers and memories into other data similarly represented as physical quantities within the computer system registers or memories or other such information storage, transmission, or display devices.

Computer System Environment

Referring to FIG. 1, a computer system 112 is illustrated. Within the following discussions of the present invention, certain processes and steps are discussed that are realized, in one embodiment, as a series of instructions (e.g., software program) that reside within computer readable memory units of system 112 and executed by processors of system 112. When executed, the instructions cause computer system 112 to perform specific actions and exhibit specific behavior which is described in detail to follow.

Specific aspects of the present invention are operable within a programmed computer aided design (CAD) system. A CAD system 112 operable to implement the elements of the present invention is shown in FIG. 1. In general, the CAD system 112 of the present invention includes an address/data bus 100 for communicating information, one or more central processor(s) 101 coupled with bus 100 for processing information and instructions, a computer readable volatile memory unit 102 (e.g., random access memory, static RAM, dynamic RAM, etc.) coupled with bus 100 for storing information and instructions for the central processor(s) 101, a computer readable non-volatile memory unit 103 (e.g., read only memory, programmable ROM, flash memory, EPROM, EEPROM, etc.) coupled with bus 100 for storing static information and instructions for processor(s) 101. System 112 can optionally include a mass storage computer readable data storage device 104, such as a magnetic or optical disk and disk drive coupled with bus 100 for storing information and instructions. Optionally, system 112 can also include a display device 105 coupled to bus 100 for displaying information to the computer user, an alphanumeric input device 106 including alphanumeric and function keys coupled to bus 100 for communicating information and command selections to central processor(s) 101, a cursor control device 107 coupled to bus for communicating user input information and command selections to the central processor(s) 101, and a signal input/output device 108 coupled to the bus 100 for communicating messages, command selections, data, etc., to and from processor(s) 101.

Program instructions executed by the CAD system can be stored in RAM 102, ROM 103, or the storage device 104 and, when executed in a group, can be referred to as logic blocks or procedures. It is appreciated that data produced at the various logic synthesis stages of the present invention, including representations of the different levels of abstraction of the integrated circuit design, can also be stored in RAM 102, ROM 103, or the storage device 104 as shown in FIG. 1.

The display device 105 of FIG. 1 utilized with the computer system 112 of the present invention may be a liquid crystal device, cathode ray tube, or other display device suitable for creating graphic images and alphanumeric characters recognizable to the user. The cursor control device 107 allows the computer user to signal dynamically the two dimensional movement of a visible pointer on a display screen of the display device 105. Many implementations of the cursor control device are known in the art including a trackball, mouse, joystick, or special keys on the alphanumeric input device 105 capable of signaling movement of a given direction or manner of displacement.

Embodiments of the Invention

Embodiments of the present invention provide a method and system for a tiling bias design for an integrated circuit device to facilitate efficient design rule checking. The method is implemented in a computer implemented design synthesis system. The method includes receiving, or otherwise accessing, an integrated circuit design (e.g., a circuit netlist), and creating therein a deep N-well (DNW) bias voltage distribution structure. The structure includes a plurality of tiles arranged to distribute a bias voltage to a plurality of N-wells of the circuit netlist. The tiles are arranged and sized to optimize the operation of various design synthesis tools, such as, for example, DRC (design rule checking) tools.

Figure 2:
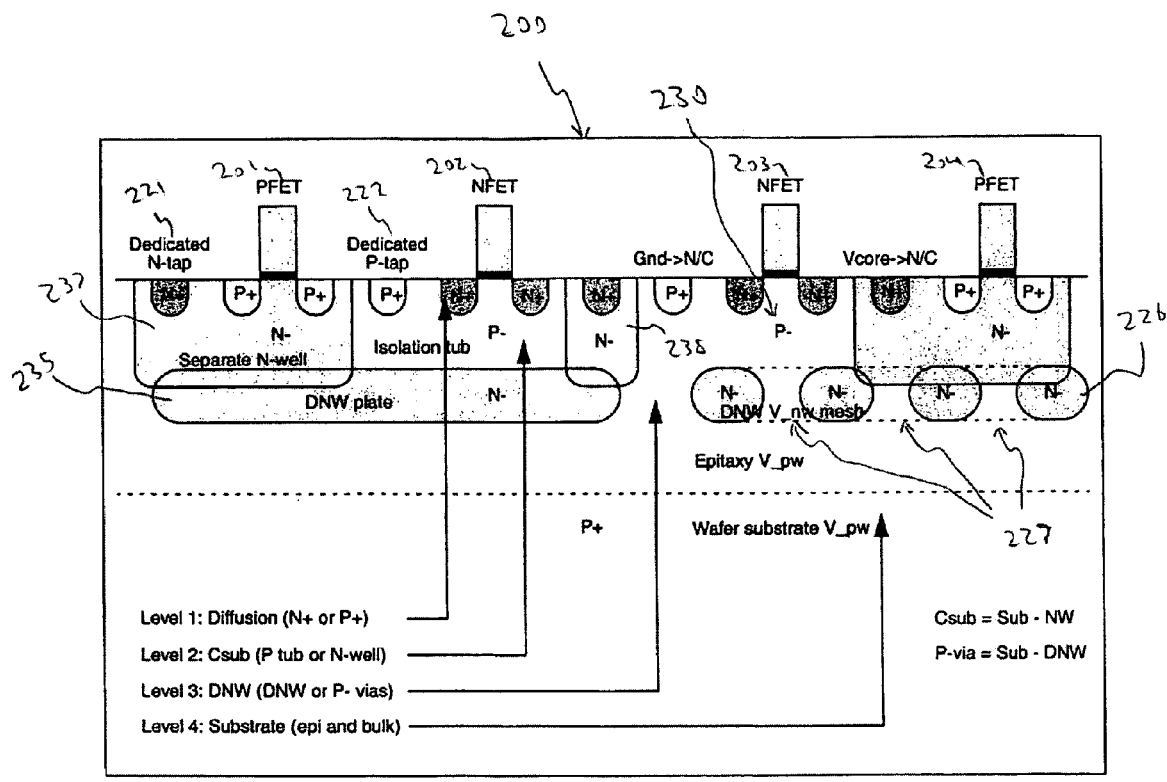
FIG. 2 shows an exemplary integrated circuit device in accordance with one embodiment of the present invention.

FIG. 2 shows an exemplary integrated circuit device 200 in accordance with one embodiment of the present invention. As depicted in FIG. 2, the integrated circuit device 200 shows a plurality of connections to implement substrate body-biasing. For example, a regulation circuit (not shown) can be coupled to provide body bias currents to a PFET 201 through a dedicated bias tap 221, or to the NFET 202 through a dedicated bias tap 222.

Referring still to FIG. 2, a bias voltage distribution structure may use a deep N-well (DNW) mesh structure 226 to distribute bias voltages. The N-well bias (Vnw) may be distributed through the mesh structure 226 and the P-well bias (Vpw) may be distributed through the substrate and then up through holes 227 in the mesh structure 226 to the P-wells (e.g., P well 230). Bias-isolated Vnw regions are formed by N-wells (e.g., DNW plate 235) that are isolated from the DNW mesh structure 226 and provided dedicated N-taps (e.g., tap 221). Bias-isolated Vpw regions are formed by P-wells contained in isolated tubs (DNW floor 235, NW walls) and provided dedicated P-taps (e.g., tap 222). As shown in FIG. 2, the structures can be fabricated through different levels of ion implantation or diffusion. For example, a shallow diffusion can be used to form the source and drains of the transistors, and so on, as indicated.

Figure 3:
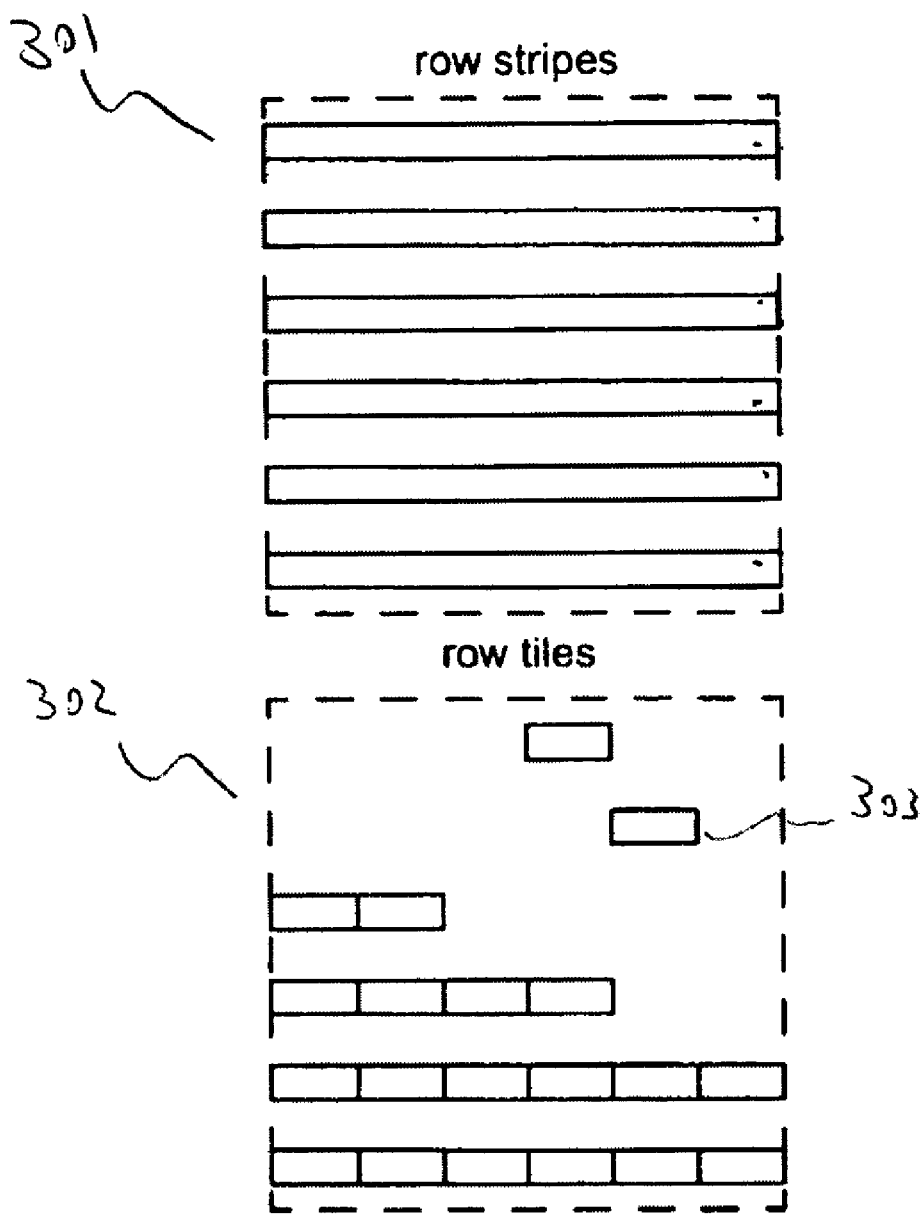
FIG. 3 shows a diagram showing a plurality of row type bias voltage distribution structures and a diagram illustrating a plurality of bias distribution row tiles in accordance with one embodiment of the present invention.

FIG. 3 shows a diagram 301 showing a plurality of row type bias voltage distribution structures and a diagram 302 illustrating a plurality of bias distribution row tiles in accordance with one embodiment of the present invention.

As described above, a bias design for a given integrated circuit device may use a deep N-well (DNW) mesh structure to distribute bias voltages. The N-well bias (Vnw) may be distributed through the mesh structure and the P-well bias (Vpw) may be distributed through the substrate and then up through holes in the mesh structure. Conventionally, as shown in diagram 301, the mesh consists of long stripes of DNW in various arrangements, such as rows, columns, or diagonals. A row mesh is shown in diagram 301. The rows of the mesh extend across the components of the integrated circuit device to distribute the bias voltages in the manner described above.

It should be noted that conventionally, the long stripes can potentially create a layout checking inefficiency. For example, some DRC (design rule checking) algorithms use bounding boxes to accelerate checking. Generally, a bounding box is the minimum rectangle that encloses a shape expanded by the largest layout rule that needs to be checked. Such checks include, structure width checks, spacing checks, overlap checks, and the like.

Generally, for given DRC tool, if the bounding boxes of two shapes do not overlap (e.g., no common X-range or Y-range) then the two shapes are known to not interfere. Detailed checking by the DRC algorithms is quickly determined to be not required. However, if the bounding boxes touch, than detailed checking by the DRC algorithms is required. Such detailed checking is expensive in terms of time and computer system resources consumed.

Thus, the long stripes (e.g., as shown in diagram 501 of FIG. 5) have large bounding boxes. Similarly, row and column stripes have a large bounding box, where one axis of the box can often span the entire integrated circuit design. Diagonal stripes have large bounding boxes on both axis. Some diagonal stripes have bounding boxes that span the entire design and must be checked in detail against all N objects that comprise the design.

Such large bounding boxes are exceedingly inefficient with respect to DRC in terms of time and computer system resources consumed. For example, For N objects to be checked vs. DNW, diagonal stripes require order $N^{1/2} \times N = N^{3/2}$ detailed checks (number of stripes×number of objects per stripe).

DNW tiles with small bounding boxes in accordance with embodiments of the present invention avoid this problem. Diagonal tiles in accordance with one embodiment of the present invention are shown in diagram 502 FIG. 5. Each tile (e.g., tile 503) of diagram 502 is designed to produce a bounding box of approximately 4× the DNW layout rules on both axis:

DNW_width+DNW_space+2×largest_DNW_rule

With typical DRC algorithms, detailed checks will occur for each shape near a given tile. For N objects to be checked vs. DNW covered by N/K tiles, tiles require order N/K×K=N detailed checks (number of tiles×number of shapes per tile). This is an improvement factor of order $N^{1/2}$ vs. the conventional diagonal long stripe method.

Figure 4:
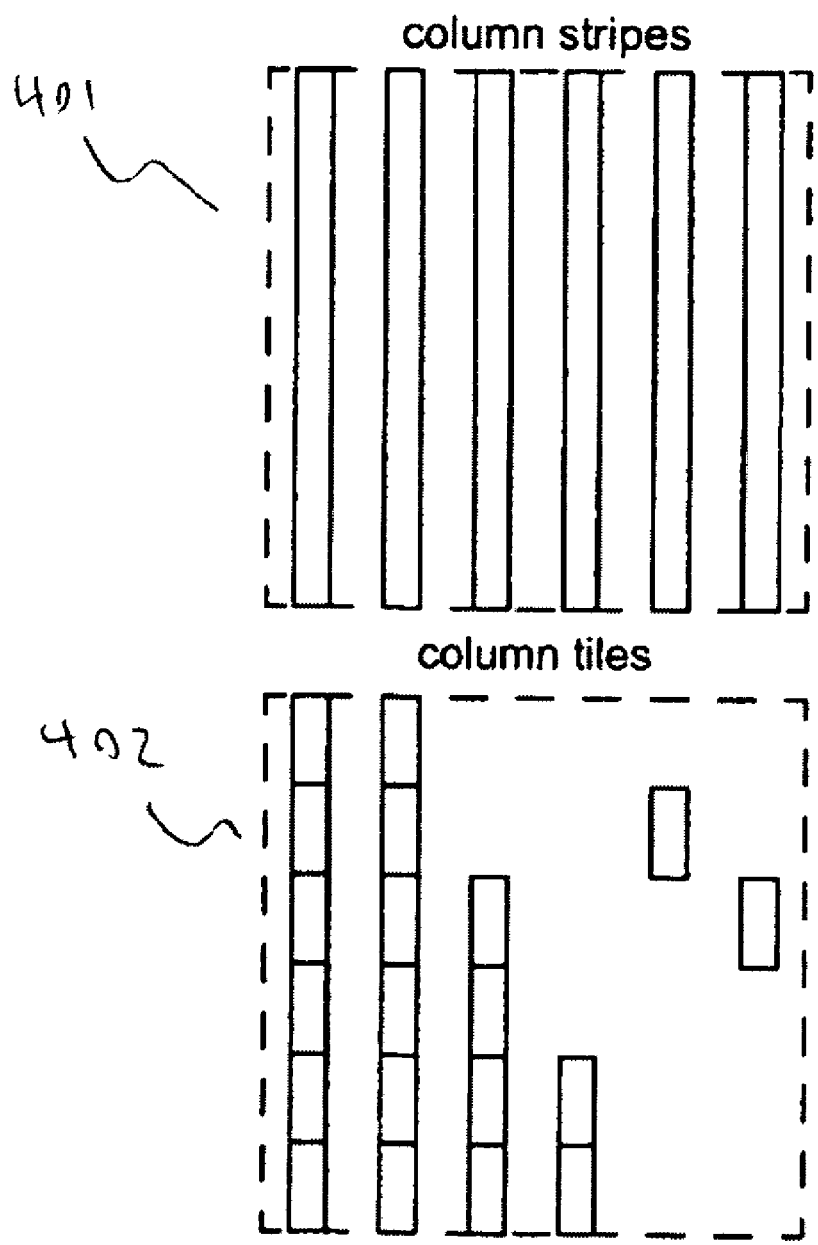
FIG. 4 shows a diagram showing a plurality of column type bias voltage distribution structures and a diagram illustrating a plurality of bias distribution column tiles in accordance with one embodiment of the present invention.
Figure 5:
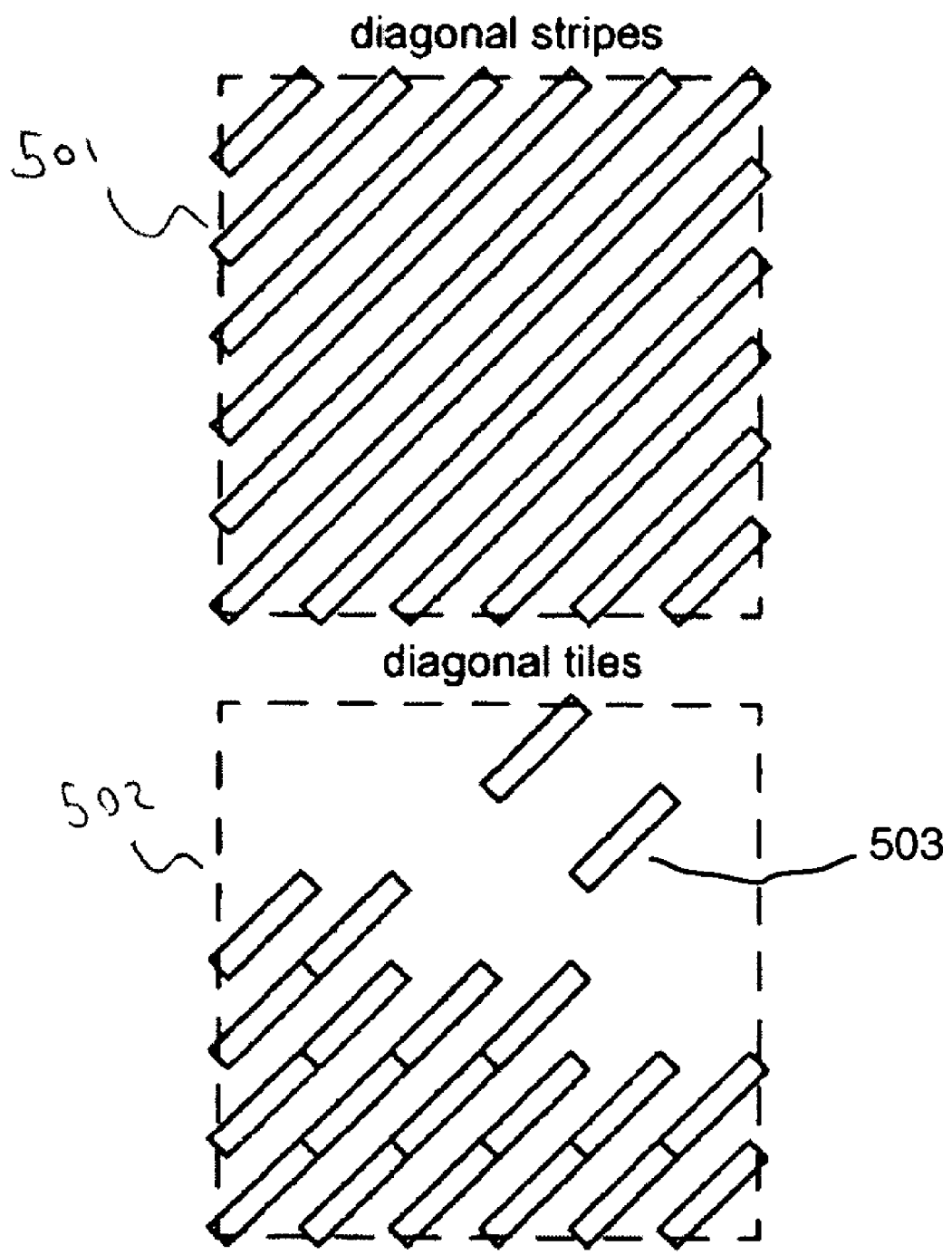
FIG. 5 shows a diagram showing a plurality of diagonal type bias voltage distribution structures and a diagram illustrating a plurality of bias distribution diagonal tiles in accordance with one embodiment of the present invention.
Figure 6:
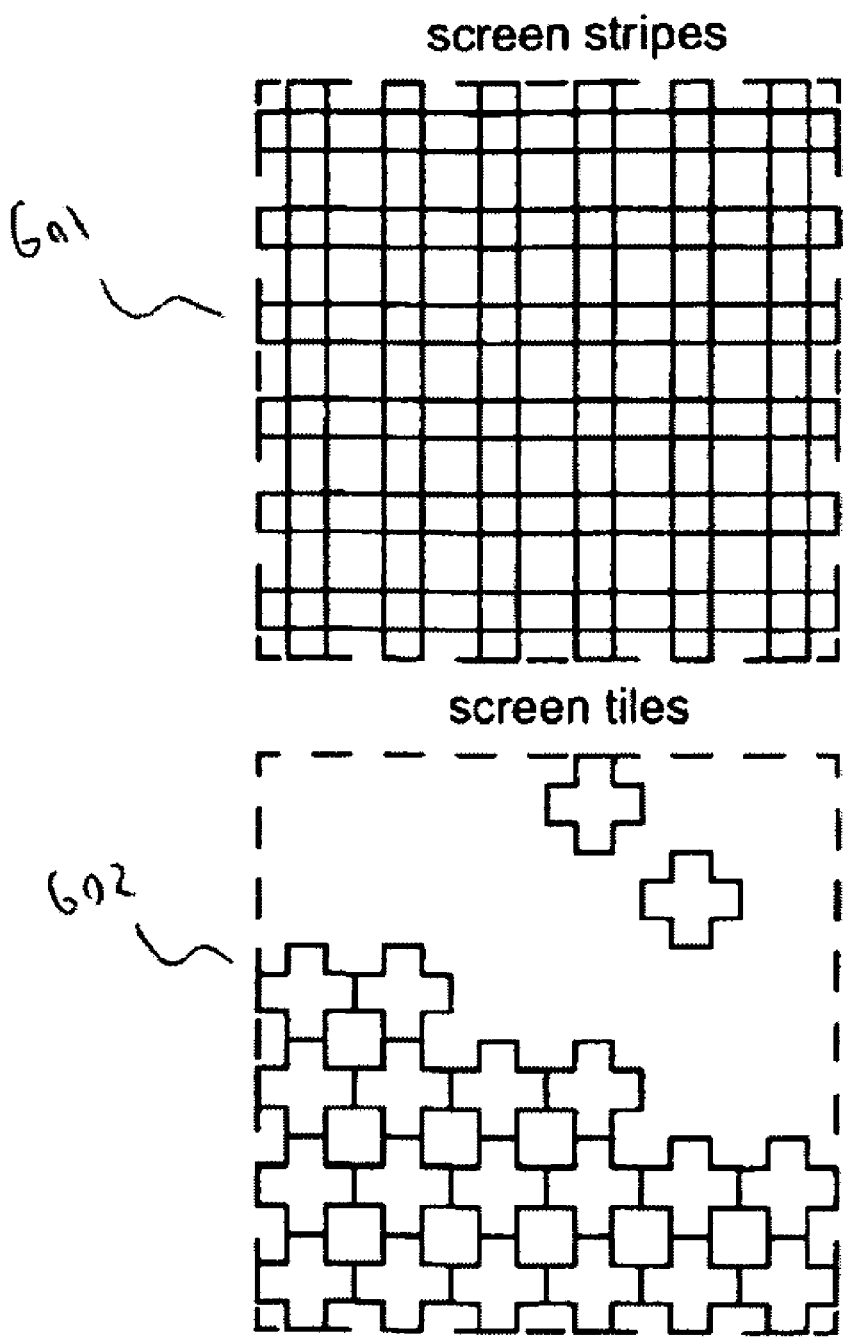
FIG. 6 shows a diagram showing a plurality of column screen type bias voltage distribution structures and a diagram illustrating a plurality of bias distribution column screen tiles in accordance with one embodiment of the present invention.
Figure 7:
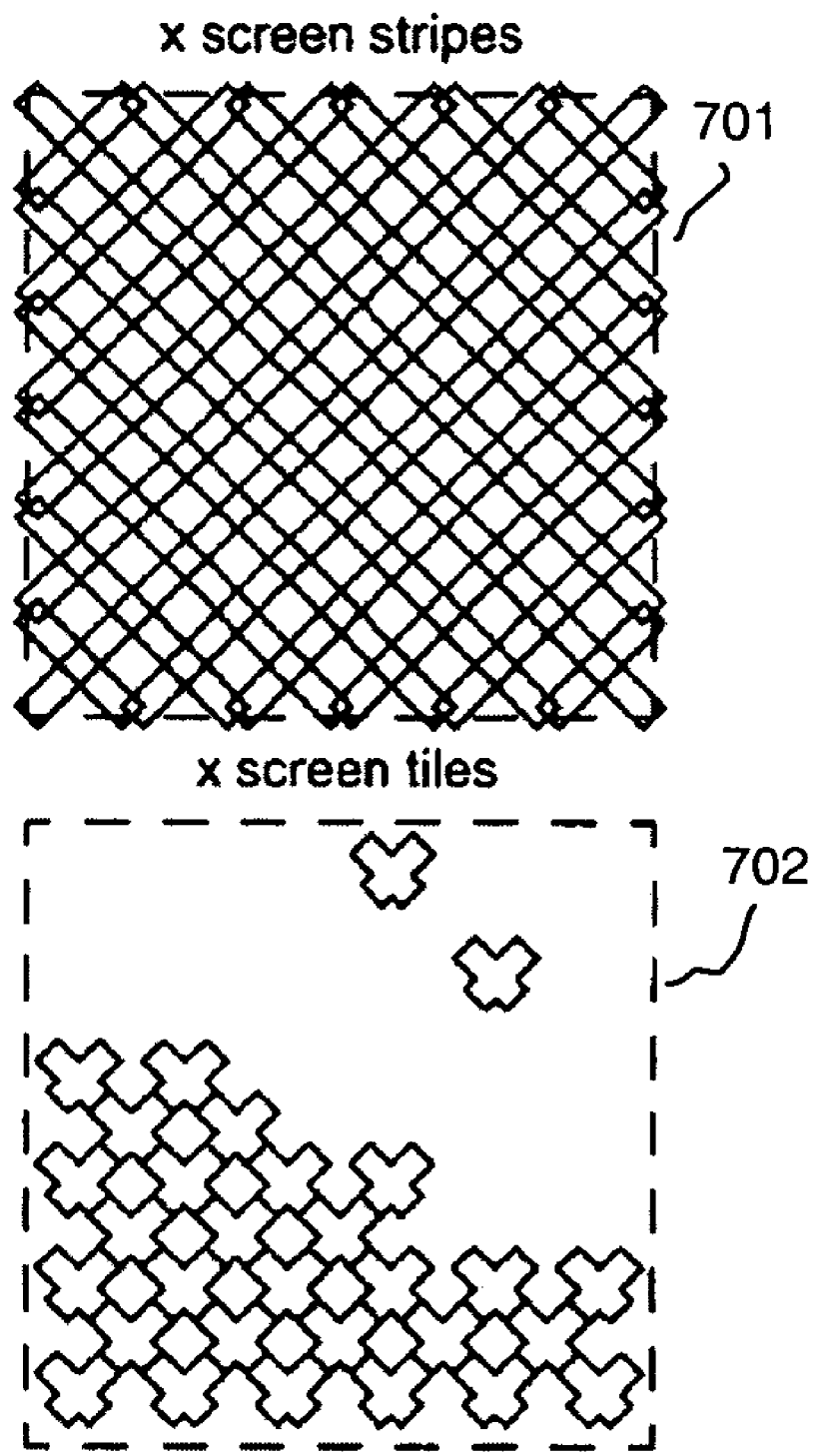
FIG. 7 shows a diagram showing a plurality of diagonal screen type bias voltage distribution structures and a diagram illustrating a plurality of bias distribution diagonal screen tiles in accordance with one embodiment of the present invention.

FIG. 4 through FIG. 7 show a respective conventional DNW mesh structure (e.g., columns, diagonals, screen stripes, diagonal screen stripes) with a corresponding DRC efficient tile embodiment of the present invention (e.g., column tile, diagonal tile, column screen tile, and diagonal screen tile). For example, FIG. 4 shows vertical column stripes in diagram 401 and corresponding column tiles in accordance with one embodiment of the present invention in diagram 402. FIG. 5 shows diagonal stripes in diagram 501 and corresponding diagonal tiles in accordance with one embodiment of the present invention in diagram 502. FIG. 6 shows column screen stripes in diagram 601 and corresponding column screen tiles in accordance with one embodiment of the present invention in diagram 602. FIG. 7 shows diagonal screen stripes in diagram 701 and corresponding diagonal screen tiles in accordance with one embodiment of the present invention in diagram 702.

In each of the examples shown in FIG. 4 through FIG. 7, the plurality of tiles are arranged in orthogonal grid with respect to the components of the integrated circuit design (e.g., a circuit netlist). The orthogonal grid of tiles are arranged in the repeatable modular pattern with respect to the components of the integrated circuit design. In this manner, groups of tiles, or even individual tiles themselves, are well-suited to parallel computation. As described above, in each case, each of the plurality of tiles is size to facilitate the operation of DRC algorithms (e.g., DNW_width+DNW_space+2×largest_DNW_rule). For example, each of the plurality of tiles are preferably approximately 4 times the size of a design rule checking constraint for the circuit netlist.

The foregoing descriptions of specific embodiments of the present invention have been presented for purposes of illustration and description. They are not intended to be exhaustive or to limit the invention to the precise forms disclosed, and obviously many modifications and variations are possible in light of the above teaching. The embodiments were chosen and described in order to best explain the principles of the invention and its practical application, to thereby enable others skilled in the art to best utilize the invention and various embodiments with various modifications as are suited to the particular use contemplated. It is intended that the scope of the invention be defined by the claims appended hereto and their equivalents.

What is claimed is:

1. In a computer implemented synthesis system, a tiling bias design method for an integrated circuit device, comprising the computer implemented steps of:
    receiving a circuit netlist, the circuit netlist representing an integrated circuit design to be realized in physical form; and
    including a deep N-well bias voltage distribution structure within the circuit netlist, wherein the structure comprises a plurality of tiles arranged to distribute a bias voltage to a plurality of N-wells of the circuit netlist, wherein each of the plurality of tiles are less than 4 times the size of a design rule checking constraint for the circuit netlist.

2. The method of claim 1, wherein the plurality of tiles are arranged in an orthogonal grid with respect to the components of the circuit netlist.

3. The method of claim 2, wherein the orthogonal grid of the plurality of tiles are arranged in a repeatable modular pattern with respect to the components of the circuit netlist.

4. The method of claim 1, wherein each of the plurality of tiles is sized to facilitate operation of a design rule checking algorithm.

5. The method of claim 1, wherein each of the plurality of tiles are less than 5 times the size of a design rule checking constraint for the circuit netlist.

6. The method of claim 1, wherein each of the plurality of tiles is a diagonal tile, column tile, row tile, column screen tile, or diagonal screen tile.

7. An integrated circuit device, comprising:
    an integrated circuit die having a plurality of circuit components fabricated thereon; and
    a deep N-well bias voltage distribution structure within the integrated circuit die, wherein the structure comprises a plurality of tiles arranged to distribute a bias voltage to a plurality of N-wells of the integrated circuit die,
    wherein each of the plurality of tiles are less than 4 times the size of a design rule checking constraint for the integrated circuit die.

8. The integrated circuit device of claim 7, wherein the plurality of tiles are arranged in an orthogonal grid with respect to the components of the integrated circuit die.

9. The integrated circuit device of claim 8, wherein the orthogonal grid of the plurality of tiles are arranged in a repeatable modular pattern with respect to the components of the integrated circuit die.

10. The integrated circuit device of claim 7, wherein each of the plurality of tiles is sized to facilitate operation of a design rule checking algorithm.

11. The integrated circuit device of claim 7, wherein each of the plurality of tiles is a diagonal tile, column tile, row tile, column screen tile, or diagonal screen tile.

12. In a computer system comprising a processor coupled to a bus and a memory coupled to the bus, a computer readable memory having instructions stored there in that when executed by the processor implement a tiling bias design method, comprising:
    receiving a circuit netlist, the circuit netlist representing an integrated circuit design to be realized in physical form; and
    including a deep N-well bias voltage distribution structure within the circuit netlist, wherein the structure comprises a plurality of tiles arranged to distribute a bias voltage to a plurality of N-wells of the circuit netlist,
    wherein each of the plurality of tiles are less than 4 times the size of a design rule checking constraint for the circuit netlist.

13. The computer readable media of claim 12, wherein the plurality of tiles are arranged in an orthogonal grid with respect to the components of the circuit netlist.

14. The computer readable media of claim 13, wherein the orthogonal grid of the plurality of tiles are arranged in a repeatable modular pattern with respect to the components of the circuit netlist.

15. The computer readable media of claim 12, wherein each of the plurality of tiles is sized to facilitate operation of a design rule checking algorithm.

16. The computer readable media of claim 12, wherein each of the plurality of tiles is a diagonal tile, column tile, row tile, column screen tile, or diagonal screen tile.

* * * * *